(12) United States Patent
Araujo et al.

(10) Patent No.: US 6,403,508 B1
(45) Date of Patent: Jun. 11, 2002

(54) FUSED SILICA WITH CONSTANT INDUCED ABSORPTION

(75) Inventors: Roger J. Araujo, Horseheads; Nicholas F. Borrelli, Elmira; Robert E. McLay, North Syracuse; Daniel R. Sempolinski, Painted Post; Charlene M. Smith, Corning, all of NY (US)

(73) Assignee: Corning Incorporated, Corning, NY (US)

( * ) Notice: Subject to any disclaimer, the term of this patent is extended or adjusted under 35 U.S.C. 154(b) by 7 days.

(21) Appl. No.: 09/583,631

(22) Filed: May 31, 2000

(51) Int. Cl.⁷ .................................................. C03C 3/06
(52) U.S. Cl. ......................................... 501/54; 501/54
(58) Field of Search ............................................ 504/54

(56) References Cited

U.S. PATENT DOCUMENTS

| | | | |
|---|---|---|---|
| 5,043,002 A | 8/1991 | Dobbins et al. | 65/3.12 |
| 5,152,819 A | 10/1992 | Blackwell et al. | 65/3.12 |
| 5,668,067 A * | 9/1997 | Araujo et al. | 501/54 |
| 5,696,038 A | 12/1997 | Maxon | 501/54 |
| 5,707,908 A | 1/1998 | Komine et al. | 501/53 |
| 5,896,222 A | 4/1999 | Rosplock et al. | 359/355 |
| 5,922,100 A | 7/1999 | Cain et al. | 65/531 |
| 5,951,730 A | 9/1999 | Schermerhorn | 65/17.3 |
| 6,174,830 B1 * | 1/2001 | Jinbo et al. | 501/54 |

OTHER PUBLICATIONS

Araujo et al., "Induced Absorption in Silica—A preliminary Model," Proceedings of SPIE—Inorganic Optical Materials, vol. 3424, 1998, pp. 1–7 No month.

* cited by examiner

*Primary Examiner*—Karl Group
(74) *Attorney, Agent, or Firm*—Adenike A. Adewuya; Timothy M. Schaeberle

(57) ABSTRACT

An optical member includes a fused silica glass having a concentration of $\equiv$SiH moiety below detection limit as measured by Raman spectroscopy and a concentration of molecular hydrogen of at least $1 \times 10^{17}$ molecules/cm³. The fused silica glass exhibits an induced absorption level which quickly attains an initial peak upon exposure to irradiation and rapidly decays to a low value. The induced absorption level after decaying to the low value remains substantially unchanged by further irradiation.

4 Claims, 7 Drawing Sheets

FUSED SILICA WITH CONSTANT INDUCED ABSORPTION

BACKGROUND OF THE INVENTION

1. Technical Field

The invention relates to production of fused silica optical elements for use in transmitting ultraviolet radiation and use of the optical elements in microlithography systems.

2. Background Art

Excimer lasers and other lasers that operate in the short ultraviolet (UV) region are finding more application in microelectronics fabrication. In particular, excimer lasers are used in microlithography systems to produce integrated circuits with critical features in the sub-micron range. Generally, microlithography systems include a deep UV laser light source, an illumination lens system, and a projection lens system. The illumination system expands and homogenizes the intensity of the laser beam, and the imaging lens system projects a very high resolution image of a mask onto a photosensitized silicon wafer. Current microlithography systems use KrF excimer lasers, which operate at 248 nm, to produce integrated circuits with critical features of about 0.35 µm and smaller. Shorter-wavelength lasers such as ArF excimer lasers can produce integrated circuits with even smaller critical features than possible with the KrF excimer lasers. However, the successful use of ArF lasers and other short UV radiation in microlithography systems depends on the availability of optical elements that can effectively transmit these wavelengths.

Fused silica glass has received a lot of attention lately for its ability to transmit short UV radiation. Unfortunately, the response of fused silica to prolonged exposure to high energy radiation is gradual monotonic development of absorption at the wavelength of the exposure beam. Electromagnetic radiation with wavelength as long as 248 nm is sufficiently energetic to induce absorption in the fused silica when applied to the fused silica at high doses. An exposure beam with wavelength as short as 193 nm is considerably more effective in producing induced absorption in the fused silica. Araujo et al. have demonstrated that this induced absorption is the result of photolysis of pre-existing defects in the glass structure, see, Araujo et al., "Induced Absorption in Silica—A preliminary Model," Proceedings of SPIE—Inorganic Optical Materials, vol. 3424, 1998, pages 1–7. The photolysis leads to the creation of an E' center, which is a single paramagnetic electron in a silicon orbital projecting into interstitial space of the glass structure. This E' center has an absorption band that is roughly centered at a wavelength of 214 nm but extends to shorter wavelengths.

Induced absorption is particularly problematic for applications employing ArF lasers and other short UV radiation with wavelengths within the absorption band of the E' center. The problem is two-fold. The first part of the problem is that the induced absorption attenuates the exposure beam, producing optical distortion. The second part of the problem stems from the fact that the absorption is constantly increasing over the duration of exposure. If optical distortion were the only problem, it would be possible to anticipate the induced absorption and compensate for it. However, because the induced absorption is constantly changing, this is not possible. Clearly, if it were possible to provide a way in which the induced absorption can quickly achieve a constant value, then it would be possible to compensate for phase changes in the exposure beam that is attributable to the induced absorption.

SUMMARY OF THE INVENTION

The invention is an optical member which comprises fused silica glass having a concentration of ≡SiH moiety below detection limit as measured by Raman spectroscopy and a concentration of molecular hydrogen of at least $1\times10^{17}$ molecules/cm$^3$. The fused silica glass exhibits an induced absorption level which quickly attains an initial peak upon exposure to irradiation and rapidly decays to a low value. The induced absorption level after decaying to the low value remains substantially unchanged by further irradiation.

DETAILED DESCRIPTION OF THE INVENTION

Figure 1:
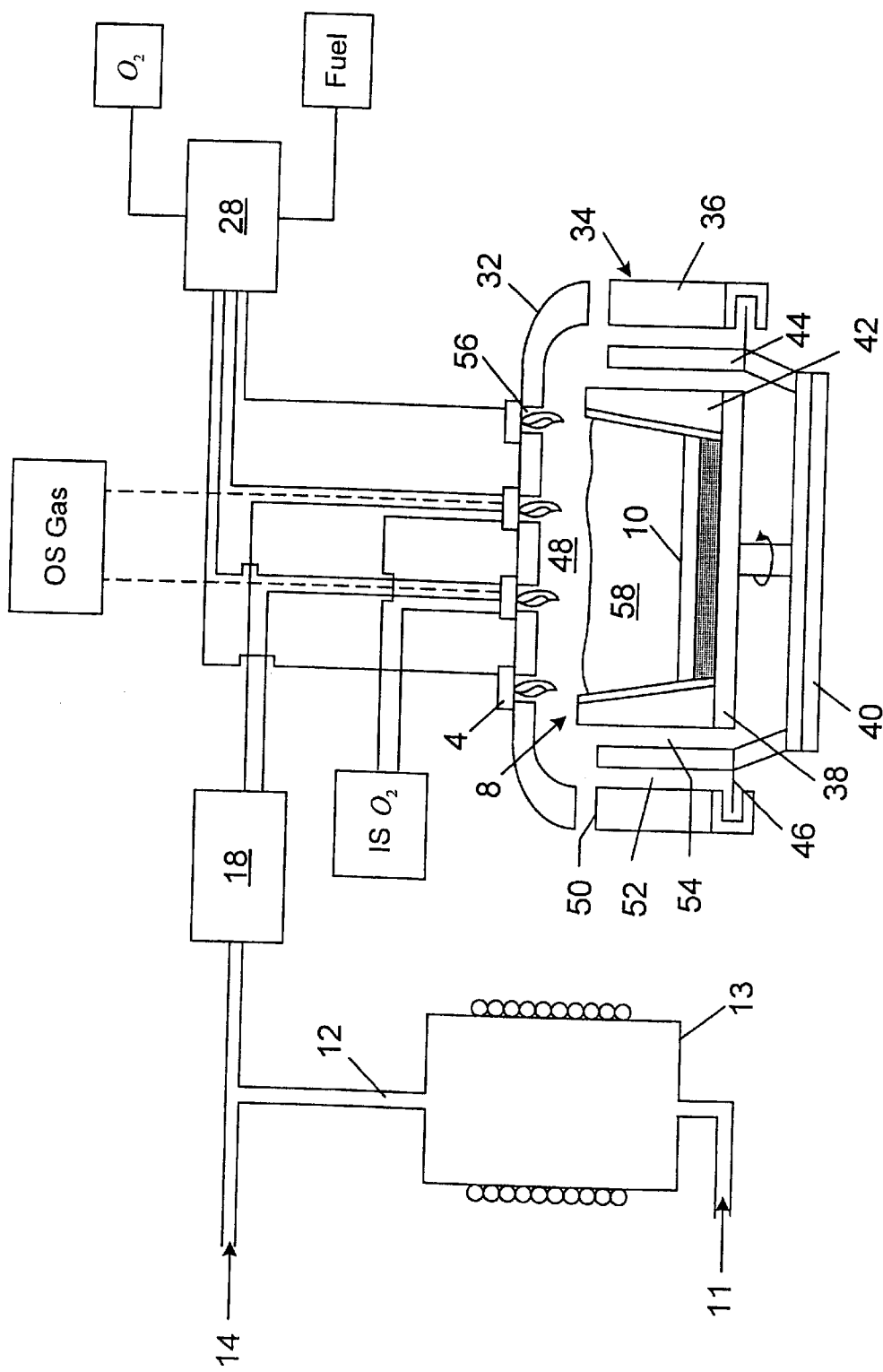
FIG. 1 is a schematic diagram of a process used to produce fused silica boules.

Embodiments of the invention provide a fused silica glass in which induced absorption as a result of exposure of the silica glass to irradiation is constrained to a low value. This constant low value is achieved in a very short time and does not change with further irradiation. The fused silica glass contains a concentration of ≡SiH moiety before exposure to irradiation. The ≡SiH moiety is a silicon atom bonded to three oxygen atoms in the glass structure and to one hydrogen atom. Embodiments of the invention are partly based on the discovery that ≡SiH can be introduced into the glass structure during fabrication of the fused silica glass. Embodiments of the invention are also based on the discovery that the amount of ≡SiH and the amount of molecular hydrogen in the silica glass can be controlled by properly adjusting the fabrication parameters of the silica glass.

There is a considerable amount of literature that indicates that hydrogen influences the amount of induced absorption produced by irradiation in fused silica glass. The mechanisms by which hydrogen mediates the induced absorption have been recently elucidated, see, for example, Araujo et al., "Induced Absorption in Silica—A preliminary Model," Proceedings of SPIE—Inorganic Optical Materials, vol. 3424, 1998, pages 1–7. Specifically, it has been shown that the E' center created by photolysis of pre-existing defects in the silica glass reacts chemically with molecular hydrogen to produce the ≡SiH moiety. This moiety absorbs 193 nm radiation much less strongly than does the E' center. Thus, its formation during photolysis of pre-existing defects in the glass is quite beneficial in reducing the strength of the induced absorption.

Although the ≡SiH moiety absorbs 193 nm radiation much less strongly than does the E' center, it does weakly absorb the radiation and, thereby, is caused to dissociate to form E' centers anew. In essence, an equilibrium between the E' center and the ≡SiH moiety is quickly established and maintained throughout exposure of the fused silica to the irradiation. The photochemical reactions can be represented by the following equation:

$$E' + \frac{1}{2}H_2 \underset{h\nu}{\rightleftharpoons} \equiv SiH \tag{1}$$

Of course, the concentrations of both the E' center and the ≡SiH moiety increase as more of the pre-existing defects are photolyzed.

Induced absorption is strongly diminished by increasing amounts of molecular hydrogen in fused silica glass. However, it has been discovered that some of the processes that introduce molecular hydrogen to the glass also produce ≡SiH directly without mediation of radiation. The initial presence of ≡SiH, of course, contributes to induced absorption. Therefore, it would be expected that the initial presence of ≡SiH in the fused silica glass would be deleterious because its photolysis would contribute to induced absorption. It is obvious that, in order to minimize induced absorption, it is desirable to introduce large amounts of molecular hydrogen to the fused silica glass, but, until recently, it was not obvious that introduction of an initial amount of ≡SiH would have any benefit whatsoever.

Embodiments of the invention are based on the discovery that an initial amount of ≡SiH can be introduced into the silica glass as the silica glass is fabricated. The process used in fabricating the silica glass is flame deposition. As illustrated in FIG. 1, the process involves passing a silicon-containing chemical precursor through a flame at burners 4 to produce fine silica soot. This silica soot is captured in a containment vessel 8 at temperatures in excess of 1600° C. At these temperatures, the silica soot 6 consolidates directly into a dense glass body called a boule 10. The reaction of the silicon-containing chemical precursor with the flame and the atmospheric condition around the containment vessel 8 is controlled such that the boule 10 contains an initial amount of ≡SiH, along with molecular hydrogen. The boule 10 is cooled and subsequently annealed in air. The glass boule 10 can be sliced to form appropriate sized blanks, which can be surface-finished to provide lenses.

A variety of silicon-containing chemical precursors can be used in the process. For environmental reasons, halogen-free precursors are preferred. U.S. Pat. No. 5,043,002 issued to Dobbins et al. and U.S. Pat. No. 5,152,819 issued to Blackwell et al., both assigned to Corning Incorporated, give a list of chemical precursors that can be used in the process. Octamethylcyclotetrasiloxane (OMCTS) is the precursor used for the forming experiments described in this disclosure. Liquid OMCTS 11 is transferred to a vaporizer 13. The liquid OMCTS 11 is vaporized in the vaporizer 13 by heating at 170–175° C. The OMCTS 12 vapors produced in the vaporizer 13 are brought into contact with a stream of inert gas 14, e.g., nitrogen ($N_2$) to prevent saturation of the OMCTS 12 vapors. The OMCTS/$N_2$ mixture is then carried to a distribution mechanism 18, which distributes the mixture to the burners 4.

Figure 2:
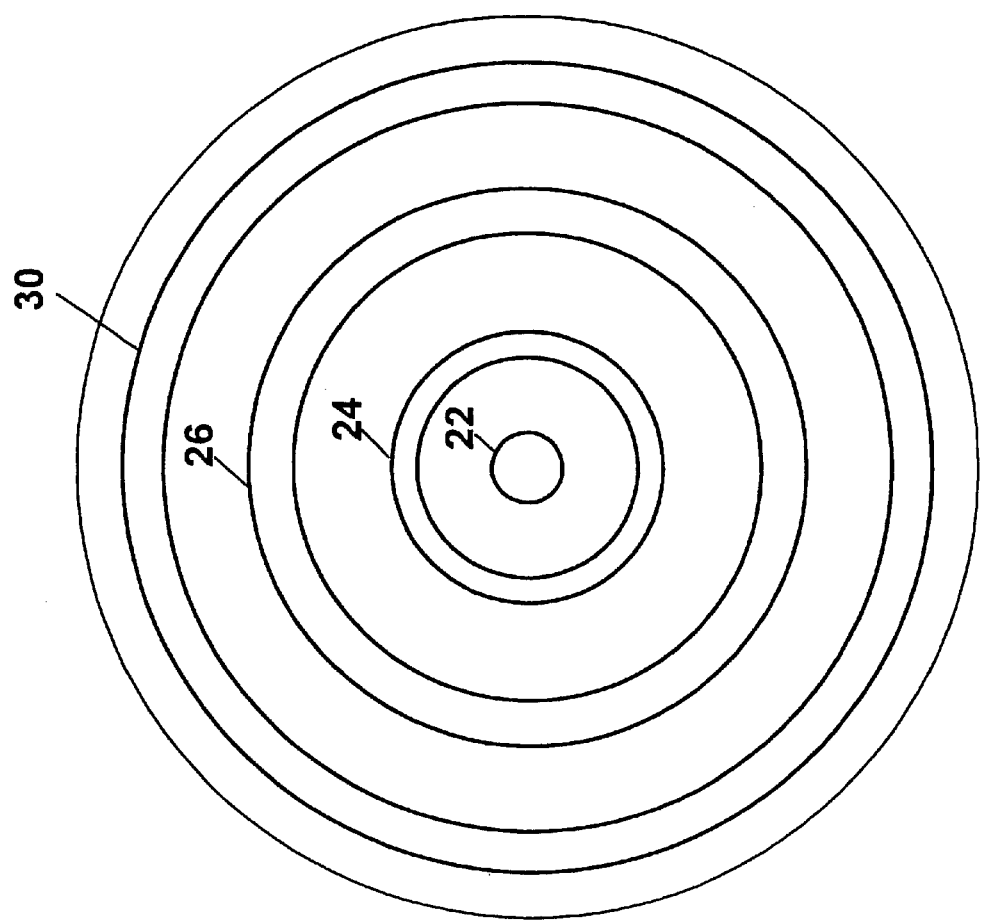
FIG. 2 shows a typical flow configuration for the burners shown in FIG. 1.

The burners 4 used to make the fused silica are premixed, natural gas burners. U.S. Pat. No. 5,922,100 issued to Cain et al., assigned to Corning Incorporated, shows examples of burner channel design that may be used in the process. FIG. 2 shows a suitable flow configuration for the burners 4. This configuration includes a center channel 22, which is a single tube that feeds the OMCTS 12 vapors and the carrier gas 16 into the flame. The center channel 22 is surrounded by an inner-shield (IS) channel 24 that provides an oxygen flow to support combustion of the OMCTS 12 vapors. The IS channel 24 is surrounded by a premix (PM) channel 26 that provides an oxygen/natural gas mixture. The oxygen/natural gas mixture is transferred to the PM channel 26 from a premixing chamber 28 (shown in FIG. 1). The burner 4 ignites the oxygen/natural gas mixture provided by the PM channel 26 to produce the flame that reacts with the OMCTS 12 vapors. The outermost (OS) channel 30 is a second shield flow of either pure oxygen or an oxygen/nitrogen mixture.

Referring back to FIG. 1, the burners 4 are arranged proximate the crown 32 of a furnace 34. A typical furnace configuration uses thirty to thirty-five burners. The general furnace configuration is described in U.S. Pat. No. 5,951,730 issued to Schermerhorn, assigned to Corning Incorporated. The furnace 34 includes a stationary wall 36, which supports the crown 32. The containment vessel 8 is disposed within the stationary wall 36. The containment vessel 8 is formed from refractory materials and includes a base 38, which is rotatably supported and which also oscillates through its attachment to an oscillation table 40. As the boule 10 is formed, the containment vessel 8 is rotated and oscillated through the base 38 to improve the index homogeneity of the silica glass. U.S. Pat. No. 5,696,038 issued to John Maxon, assigned to Corning Incorporated describes examples of oscillation patterns that can be used in the process.

The containment wall 42 of the containment vessel 8 is surrounded by an air flow wall 44, which is mounted on the oscillation table 40. A motion accommodating seal 46 is formed between the stationary wall 36 and the airflow wall 44. The space 48 between the top of the containment vessel 8 and the crown 32 is vented by a plurality of vents 50 formed at the top of the stationary wall 36. The vents 50 are connected to a suitable exhaust system (not shown) by ducting which creates a negative pressure in the space 48. The negative pressure causes air to flow upward from the annular gaps 52 and 54 around the containment vessel 8. The burners 4 near the containment wall 42 are run without OMCTS 12 vapors and are used solely to provide supplemental heat. The flames produced at the burners 4 are fed through holes 56 in the furnace crown 32. The holes 56 typically have diameters of about 1.25 inches to 1.75 inches.

The furnace 34 is drafted using filtered, ambient air flows. Temperature of the deposition cavity 58 is monitored with an optical pyrometer, which measures the temperature of the furnace crown 32. The temperature of the deposition cavity 58 is typically held at 1640° C. to 1660° C. by adjusting the vertical position of the containment vessel 8. The pressure in the deposition cavity 58 is controlled by adjusting furnace draft through changes to the exhaust fan speed and shield position at the vents 50. The furnace 34 is usually operated with cavity pressure in the range of –0.005 inches to –0.025 inches water. The boule 10 is a glass disk typically sixty inches to seventy inches in diameter and 5 to 10 inches thick. The forming process takes 100 to 200 hours depending on the required thickness of the boule. After deposition, the boule 10 is cooled in the furnace 34 to less than 200° C. over twenty-five to fourty hours. The boule 10 is then removed from the furnace 34 and annealed in air. The annealed schedule includes a hold at 1050° C. to 1080° C., followed by a slow cool to 850° C. at the rate of 5° C./hr to 10° C./hr.

The general chemistry of the boule 10 is established by controlling the chemistry of the furnace 34 at atmosphere during deposition of the silica soot 6 and not by any post-forming operation. The only exception is a minor hydrogen loss (10–20%) at the top of the boule 10, which occurs during the standard anneal in air. The chemistry of the cavity of the furnace 34 is set by balancing the fuel-to-oxygen ratio of the gases supplied to the burners 4. The fuel-to-oxygen ratio should at least 0.51%. Typically, the fuel-to-oxygen ratio will be much higher than 0.51% because more fuel-rich mixtures produce glasses with higher residual molecular hydrogen levels. The fuel content includes the natural gas and precursor flows. The oxygen content includes all of the oxygen flows from the burners 4 and the oxygen component of the ambient air flow which are drawn into the space 48 through drafting. As a result, the chemistry of furnace atmosphere is established by balancing the burner hole size, exhaust draft, and the fuel-to-oxygen ratio of the burner flows. The chemistry of the furnace cavity is monitored using a Gas Chromatography (GC) probe to sample the furnace atmosphere during deposition. The actual GC measurements depend on furnace geometry. For the furnace set-up described herein, GC readings of 0–14% hydrogen in the furnace produce glass with hydrogen concentration of 0.5 to $10 \times 10^{17}$ molecules/cm$^3$.

The following examples further illustrate the embodiments of the invention and are not intended to limit the scope of the invention as otherwise described herein.

EXAMPLE 1

A silica glass 66 with a hydrogen concentration of $1.5 \times 10^{17}$ molecules/cm$^3$ is formed using OMCTS as the chemical precursor. Table 1 below gives the rates at which the gaseous reactants used in forming the silica glass 66 are fed to the burners 4. It should be noted that the flow rates shown in Table 1 are on a per burner basis. Table 2 shows the conditions of the furnace 34 under which the silica glass 66 is formed.

TABLE 1

Flow rate for gaseous reactants used in forming silica glass 66

| Gaseous Reactant | Flow Rate |
|---|---|
| OMCTS vapors | 6.5 gm/min |
| Carrier N$_2$ | 6 standard liters per minute (slpm) |
| IS O$_2$ | 7.7 slpm |
| OS O$_2$ | 17.1 slpm (pure O$_2$) |
| PM O$_2$ | 22.5 slpm |
| PM natural gas | 21.7 slpm |

TABLE 2

Deposition conditions for forming silica glass 66

| Furnace Condition | Value |
|---|---|
| Furnace temperature | 1645° C. |
| Furnace cavity pressure | −0.020" H$_2$O |
| Exhaust flow | 4750 standard cubic feet/minute |
| Cavity H$_2$ (GC reading) | 0.0–0.5% |

EXAMPLE 2

A silica glass 127 with a hydrogen concentration of $9 \times 10^{17}$ molecules/cm$^3$ is formed using OMCTS as the chemical precursor. Table 3 below gives the rates at which the gaseous reactants used in forming the silica glass 127 are fed to the burners 4. It should be noted that the flow rates shown in Table 3 are on a per burner basis. Table 4 shows the conditions of the furnace 34 under which the silica glass 127 is formed.

TABLE 3

Flow rate for gaseous reactants used in forming silica glass 127

| Gaseous Reactant | Flow Rate |
|---|---|
| OMCTS vapors | 7.5 gm/min |
| Carrier N$_2$ | 6.9 slpm |
| IS O$_2$ | 10.4 slpm |
| OS O$_2$ | 16.3 slpm (90/10 O$_2$/N$_2$ mix) |
| PM O$_2$ | 27.5 slpm |
| PM natural gas | 31.5 slpm |

TABLE 4

Deposition conditions for forming silica glass 127

| Furnace Condition | Value |
|---|---|
| Furnace temperature | 1650° C. |
| Furnace cavity pressure | −0.008" H$_2$O |
| Exhaust flow | 4100 standard cubic feet/minute |
| Cavity H$_2$ (GC reading) | 14% |

The most important variables in determining the difference in the hydrogen concentration of the silica glasses 66 and 127 are the fuel-to-oxygen ratio in the premix (PM) and the oxygen flow in the outer shield (OS). The ratios of PM natural gas to PM oxygen for glass 66 and 127 are 0.96 and 1.15, respectively. The OS oxygen in the fabrication of glass 66 is 17.1 slpm, and the OS oxygen in the fabrication of glass 127 is 14.7 slpm, i.e., 90% of 16.3 slpm. Hence, the premix used to produce glass 127 is more fuel-rich than the premix used to produce glass 66. At the same time, the oxygen flow rate in the outer shield is lower in the fabrication of glass 127 than it is in the fabrication of glass 66. Glass 127 contains as much as nine times the dissolved molecular hydrogen in glass 66, yet the concentration of ≡SiH in both glasses is below the detection limit.

The concentration of ≡SiH is measured using Raman spectroscopy. Raman spectroscopy measurements involve shining a light beam on a sample at a selected frequency. If the sample contains molecules with a vibration absorption band that corresponds to the selected frequency, the sample will absorb some of the energy of the incident light, resulting in an emergent light with reduced intensity. The change in intensity of the light beam after it has passed through the sample may be measured and related to the concentration of the molecules within the sample. The presence of ≡SiH in glasses 66 and 127 is detected by Raman spectroscopy using light at a frequency of 2260 cm$^{-1}$. This frequency corresponds to the vibration absorption band of ≡SiH moiety. Thus, if the glasses 66 and 127 contain ≡SiH moieties, there should be a change in the intensity of the light passed through the glasses 66 and 127. However, the concentration of ≡SiH in the glasses 66 and 127 is so small that there is no noticeable change in the intensity of the light beam.

Figure 3:
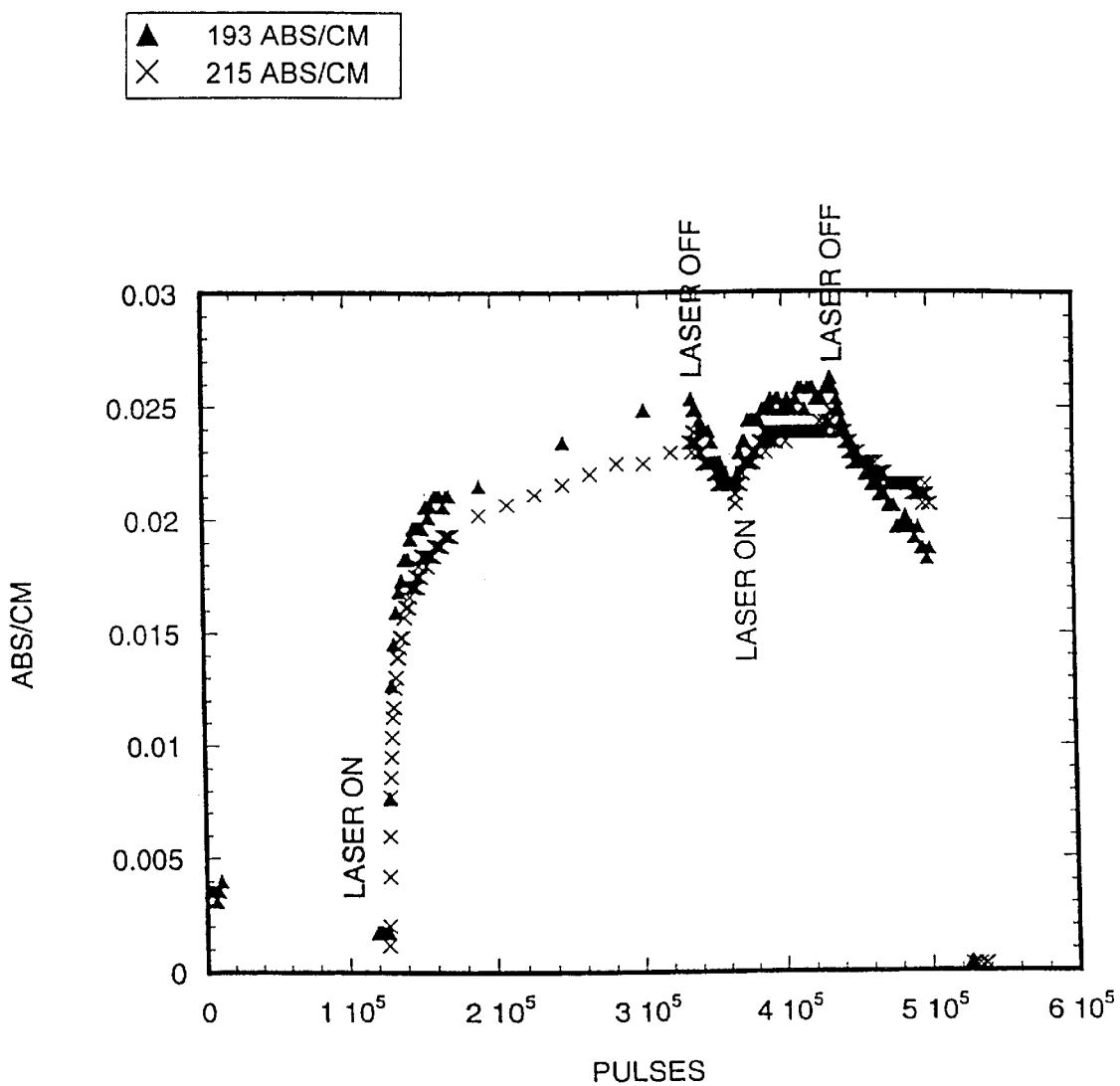
FIG. 3 compares induced absorption patterns measured at 193 nm and 215 nm.

A comparative study was carried out with respect to the silica glass produced by the process above and silica glasses produced by other processes. In order to improve the precision of the measurements, the induced absorption in each glass was measured at 215 nm where the absorption is strongest, that is, where the absorption band of the E' center is centered. FIG. 3 is a plot of change in absolute coefficient measured at 193 nm and 215 nm in absorbance units per centimeter. Measurements were made on fused silica test pieces exposed to KrF laser delivering a radiation beam of 6 mJ/cm$^2$/pulse intensity at the 248 nm wavelength. Use of this wavelength allows the processes to be carefully measured at 193 nm. FIG. 3 demonstrates that the behavior of absorption measured at 215 nm exactly replicates that of the absorption measured at 193 nm. Thus, the measurement at 215 nm is a reliable surrogate for the measurement at 193 nm.

Figure 4:
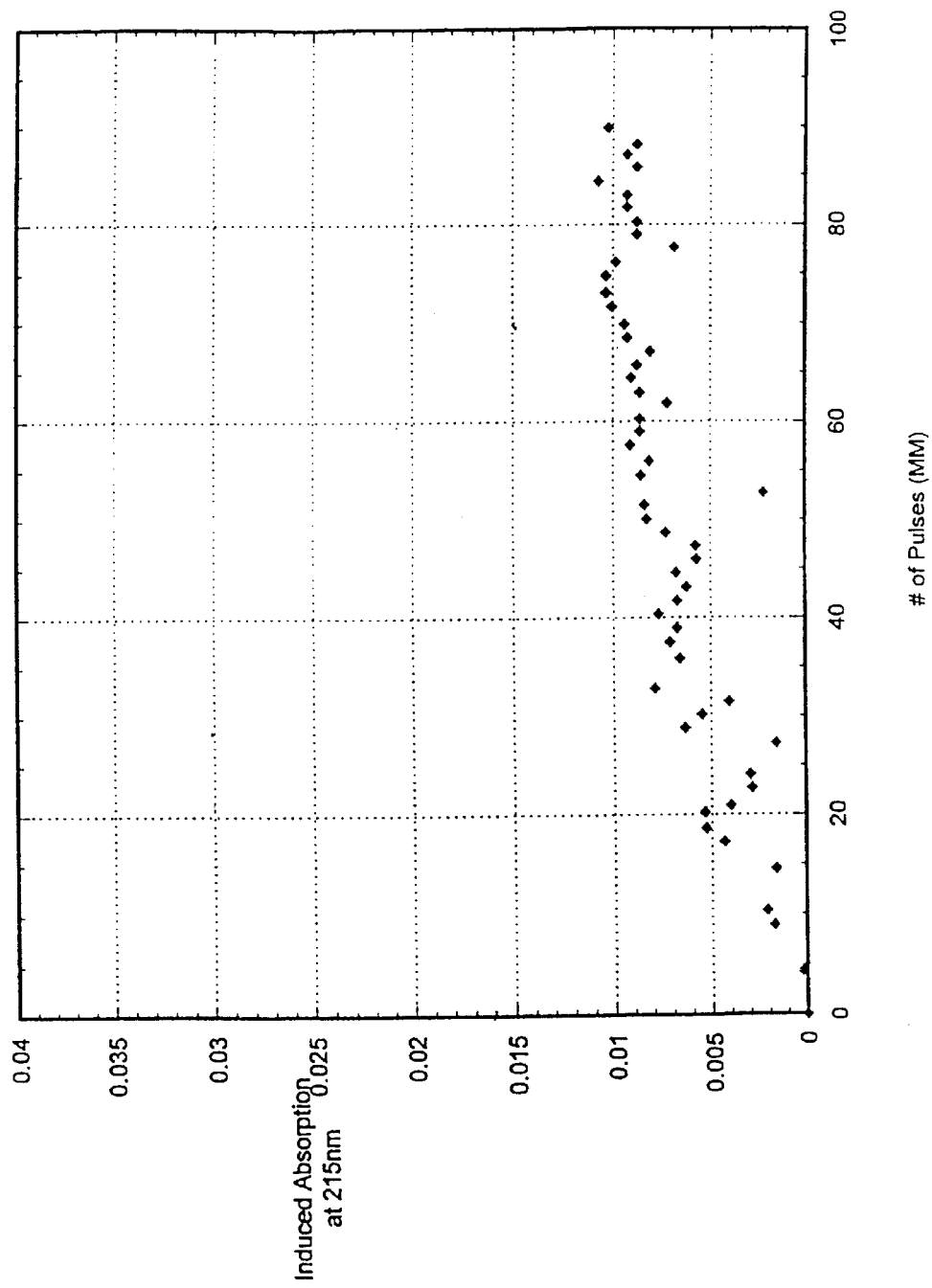
FIG. 4 is a plot of induced absorption as a function of number of exposure pulses for a prior art silica glass.

FIG. 4 shows the typical monotonically increasing induced absorption observed in a commercially available silica glass, herein referred to as glass 68. The glass 68 contains $1.5 \times 10^{17}$ molecules/cm$^3$ of hydrogen with no detectable $\equiv$SiH. Again, Raman spectroscopy using the absorption at a frequency of 2260 cm$^{-1}$ is used to detect the presence of $\equiv$SiH. The molecular hydrogen in glass 68 resulted directly from the fabrication process. The glass 68 was not exposed to hydrogen in a separate step after the boule had been formed from the deposition of the silica soot. The molecular hydrogen concentration was determined by measurement of the strength of the Raman active vibration of molecular hydrogen. The intensity of the radiation was 6 mJ/cm$^2$.

Figure 5A:
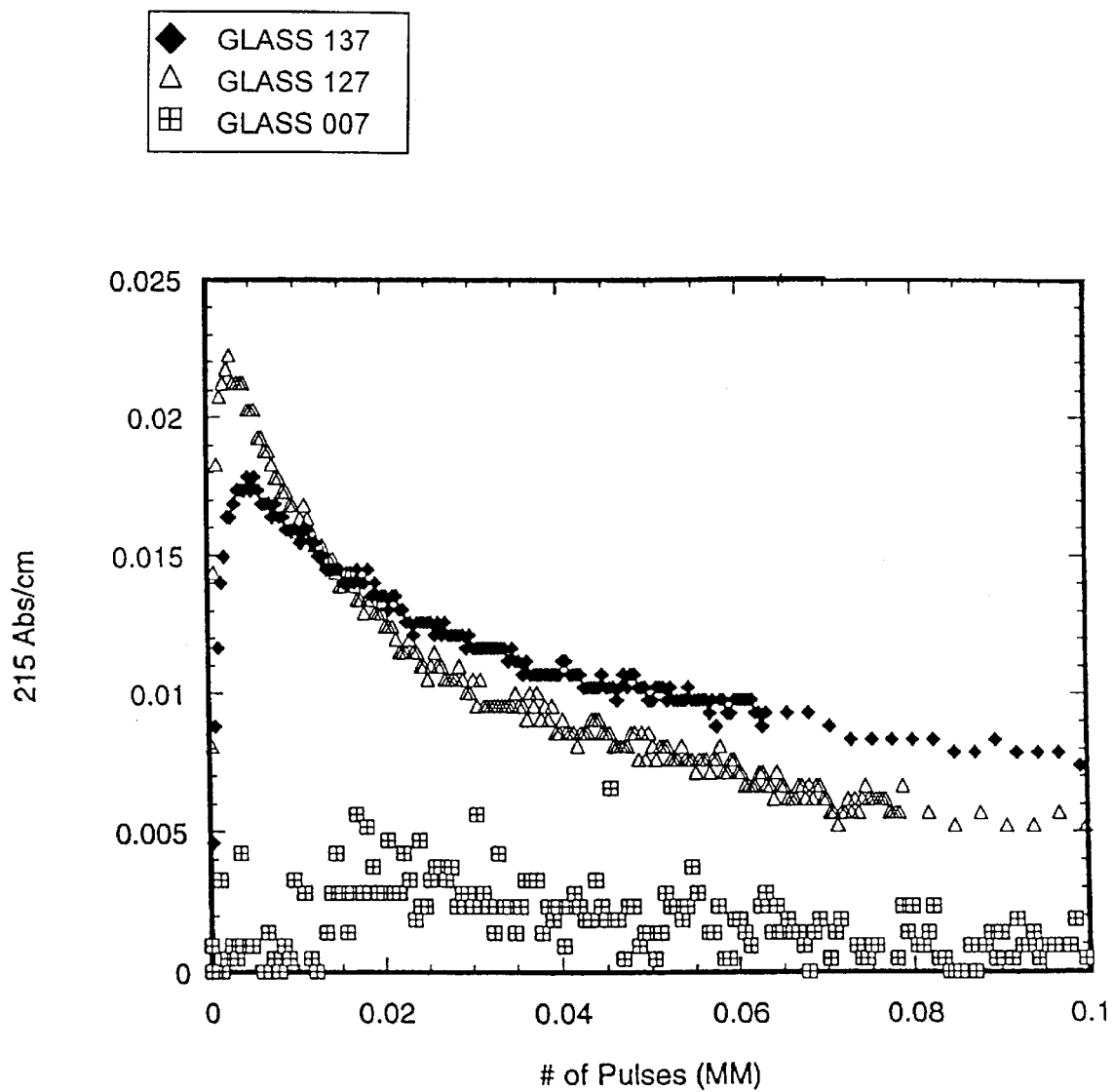
FIGS. 5A and 5B contrast the behavior of silica glass produced by the process illustrated in FIG. 1 with prior art silica glasses.
Figure 5B:
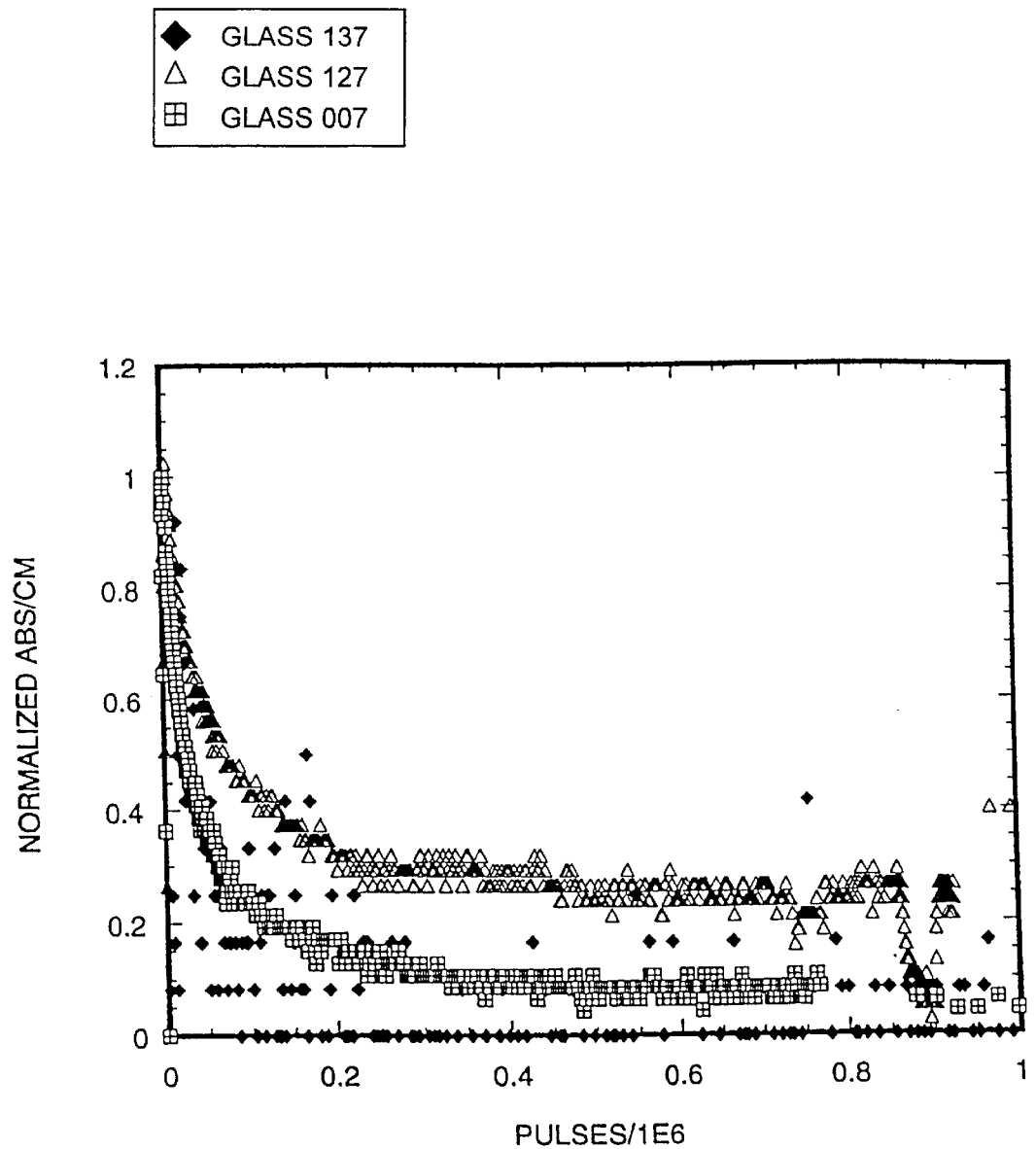

FIGS. 5A and 5B show the behavior of induced absorption in the silica glasses 007, 137, and 127 produced by the process illustrated in FIG. 1. It should be noted that FIG. 5A is merely a plot of the short time data contained in FIG. 5B but displayed on an expanded scale of time in order that the behavior of the absorption at short times can be more readily discerned. The glasses 007, 137, and 127 have higher concentrations of molecular hydrogen in comparison to the previously discussed glass 68. The silica glass 137 has a hydrogen concentration of $6.5 \times 10^{17}$ molecules/cm$^3$, the silica glass 127 has a hydrogen concentration of $9 \times 10^{17}$ molecules/cm$^3$, and the silica glass 007 has a hydrogen concentration of $3.5 \times 10^{17}$ molecules/cm$^3$.

FIG. 5A shows that as the molecular hydrogen in the silica glass is increased, a progressively stronger absorption is seen at short times, i.e., less than 0.1 million pulses, but that this absorption decreases with continued radiation. FIG. 5B indicates clearly that the absorption rapidly decreases to a low value in about 0.2 million pulses and that it does not change thereafter. It can be seen in both FIGS. 5A and 5B that the decay in the absorption strength is fastest in glass 127, which contains the most molecular hydrogen. Furthermore, the absorption in glass 127 achieves a lower value than the absorption in the glasses 007 and 137.

The reason for the appearance of a strong absorption band at short times and for the decrease in the strength of the absorption from its peak value is that the glasses 007, 137, and 127 initially contain $\equiv$SiH. The appearance of the absorption band is due to the rapid achievement of the equilibrium indicated in equation (1) above. The reason for the decrease in the absorption strength from its peak value in the glasses that initially contain $\equiv$SiH is explained by Araujo et al., "Induced Absorption in Silica—A Preliminary Model," Proceedings of SPIE—Inorganic Optical Materials, vol. 3424, 1998, pages 1–7. Although, the initial presence of $\equiv$SiH produces a slightly higher asymptotic absorption than that which would be observed in silica glasses without initial $\equiv$SiH, the rapid achievement of a constant level of induced absorption is a benefit that is worth the small price. It should be noted that a lower amount of entrapped hydrogen in the silica glass produces a smaller initial peak in absorption, see, for example, the difference in maximum absorption observed at short times for glasses 007 and 127 in FIG. 5A.

Figure 6:
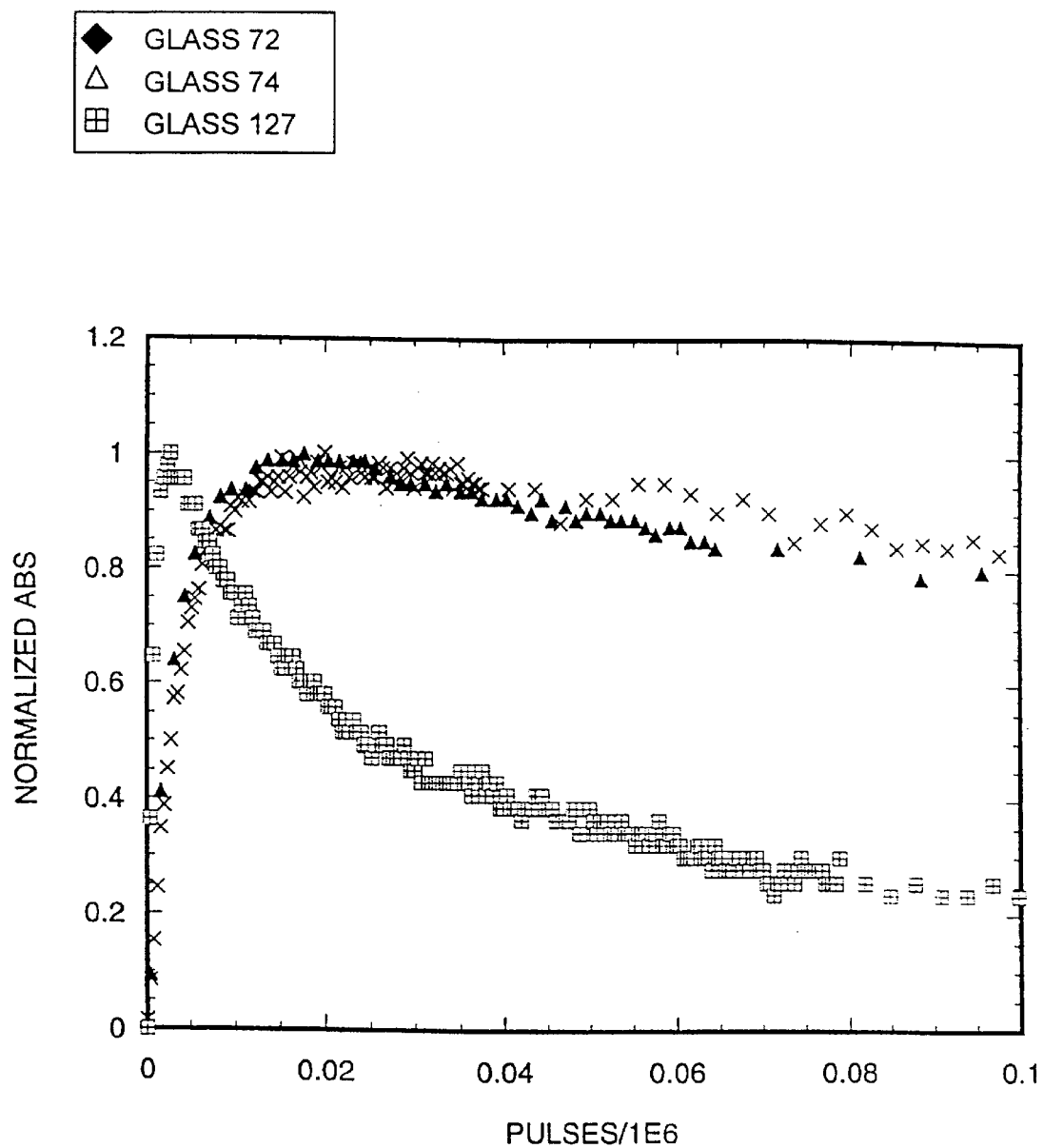
FIG. 6 is a plot of induced absorption as a function of number of exposure pulses for silica glass produced by the process illustrated in FIG. 1.

FIG. 6 contrasts the behavior of the silica glass 127 with silica glasses 72 and 74. The normalized induced absorption curves of the glasses 127, 72, and 74 are shown as a function of the number of laser pulses. Each glass contains approximately $10^{18}$ molecules/cm$^3$ of hydrogen. It can be seen that the absorption decays from its peak value in the glasses 72 and 74 less than it does in glass 127. It should be noted that the curves in FIG. 6 are normalized so that the peak absorption appear to be equal. In fact, the absolute value of the absorption peak in glass 72 is about 1.7 times greater than that of glass 127. The absolute value of the peak in glass 74 is about 3.2 times greater than that of glass 127.

Hydrogen and $\equiv$SiH were introduced into glass 72 by impregnating at low temperature ($\approx$350° C.) and subsequently heating to 1200° C. for a short time. Glass 74 is a sample of a commercially available glass made by an unknown process. Glass 74 behaves like a heat-treated impregnated glass. Both the glasses 72 and 74 contain essentially the same concentration of molecular hydrogen and similar initial concentrations of $\equiv$SiH. The $\equiv$SiH concentration in glass 72 is 0.08 in arbitrary units and the $\equiv$SiH concentration in glass 74 is 0.2, whereas the $\equiv$SiH concentration in glass 127 is below the detection limit. The $\equiv$SiH were measured by Raman spectroscopy using light at a frequency of 2260 cm$^{-1}$. It is should be noted that although the concentration of $\equiv$SiH in glass 127 is below the detection limit, the strength of the rapidly achieved peak in the induced absorption in glass 127 clearly indicates that glass 127 contains a higher initial concentration of $\equiv$SiH than the commercially available glass 68 whose absorption pattern is shown in FIG. 4. Given the differing absorption patterns exhibited by glasses 127 and 74, it can be inferred that glass 74 is made from a process different from the one used to make glass 127. Most likely, the process used to make the glass 74 is a two step process such as heating in hydrogen subsequent to deposition.

The reason for the behavior of the glasses made by the two step process is not completely understood. Nevertheless, it is completely clear that the behavior of the glass produced in the single step process is preferred. It is also clear that the specification of the concentration of molecular hydrogen is not, by itself, sufficient to determine the characteristics of the glass. The reason that the specification of the concentration of the molecular hydrogen is not sufficient to uniquely determine the characteristics of the glass is that different processes for introducing hydrogen can produce varying amounts of $\equiv$SiH. The importance of the ratio of molecular hydrogen to $\equiv$SiH has already been discussed above. Raman measurements indicate that the concentration of hydrogen in all three glasses is approximately $10^{18}$ molecules/cm$^3$. However, Raman measurements indicate significant differences in the concentrations of $\equiv$SiH. Although, the Raman cross section for the $\equiv$SiH vibration is not known, the ratio of the concentrations for the various glasses can be determined from the areas under the vibrational absorption bands. These measurements (given above) indicate that the glasses in which hydrogen is added by a step subsequent to deposition contain significantly more $\equiv$SiH than the glass formed in a single step process.

The $\equiv$SiH in the structure of the glass 127 was introduced by varying the process parameters during deposition of the silica soot. Variation of process parameters during deposition causes changes in the concentration of dissolved molecular hydrogen. Variation of process parameters also changes the ratio of molecular hydrogen to $\equiv$SiH initially present in the glass. The optimal results are obtained by controlling conditions during laydown and by avoiding subsequent steps in which glass containing high levels of hydrogen are brought to a high temperature, e.g., greater than 500° C., in the presence of hydrogen. Preferably, the concentration of molecular hydrogen in the glass is as high as possible while the concentration of ≡SiH is below detectable limit as measured by Raman spectroscopy.

While the invention has been described with respect to a limited number of embodiments, those skilled in the art will appreciate that other embodiments of the invention can be devised which are within the scope of the invention. Accordingly, the scope of the invention should be limited only by the appended claims.

What is claimed is:

1. An optical member comprising fused silica glass having a concentration of ≡SiH moiety below detection limit as measured by Raman spectroscopy and a concentration of molecular hydrogen of at least $1\times10^{17}$ molecules/cm$^3$, the fused silica glass exhibiting an induced absorption level which quickly attains an initial peak upon exposure to irradiation and rapidly decays to a low value, wherein the induced absorption level after decaying to the low value remains substantially unchanged by further irradiation.

2. The optical member of claim 1, wherein the ≡SiH moieties are introduced into the fused silica glass during fabrication of the fused silica glass without the requirement of post-treatment processes.

3. The optical member of claim 2, wherein the induced absorption level achieves the low value during exposure of the fused silica glass to 193 nm radiation.

4. The optical member of claim 1, wherein the induced absorption reaches steady state in less than 0.2 million pulses of radiation.

* * * * *